(12) United States Patent
Subramonium et al.

(10) Patent No.: US 12,040,180 B2
(45) Date of Patent: Jul. 16, 2024

(54) NITRIDE FILMS WITH IMPROVED ETCH SELECTIVITY FOR 3D NAND INTEGRATION

(71) Applicant: Lam Research Corporation, Fremont, CA (US)

(72) Inventors: Pramod Subramonium, Tualatin, OR (US); Nagraj Shankar, Tualatin, OR (US); Malay Milan Samantaray, Tualatin, OR (US); Katsunori Yoshizawa, Tualatin, OR (US); Bart J. VanSchravendijk, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 551 days.

(21) Appl. No.: 17/291,605

(22) PCT Filed: Oct. 8, 2019

(86) PCT No.: PCT/US2019/055262
§ 371 (c)(1),
(2) Date: May 5, 2021

(87) PCT Pub. No.: WO2020/096722
PCT Pub. Date: May 14, 2020

(65) Prior Publication Data
US 2021/0320004 A1    Oct. 14, 2021

Related U.S. Application Data

(60) Provisional application No. 62/757,704, filed on Nov. 8, 2018.

(51) Int. Cl.
*H01L 21/02* (2006.01)
*H01L 21/311* (2006.01)
(Continued)

(52) U.S. Cl.
CPC .. *H01L 21/02274* (2013.01); *H01L 21/02164* (2013.01); *H01L 21/0217* (2013.01);
(Continued)

(58) Field of Classification Search
CPC ......... H01L 21/02274; H01L 21/02164; H01L 21/0217; H01L 21/0228; H01L 21/31116;
(Continued)

(56) References Cited

U.S. PATENT DOCUMENTS 7,678,715 B2   3/2010   Mungekar et al.
8,883,611 B2   11/2014  Lee et al.
(Continued)

FOREIGN PATENT DOCUMENTS

KR   1020090003724 A   12/2009

OTHER PUBLICATIONS

ISR PCT/US2019/055262, dated Jan. 21, 2020, 3 pages.
PCT Written Opinion, PCT/US2019/055262, dated Jan. 22, 2020, 3 pages.

*Primary Examiner* — Mohammad A Rahman
(74) *Attorney, Agent, or Firm* — Penilla IP, APC (57) ABSTRACT

A method for depositing a nitride layer over an oxide layer to form an oxide-nitride stack is provided. The method includes supplying an inert gas to a plasma enhanced chemical vapor deposition (PECVD) reactor that supports a substrate having said oxide layer. Then, providing power to an electrode of the PECVD reactor, where the power is configured to strike a plasma. Then, flowing reactant gases into the PECVD reactor. The reactant gases include a first percentage by volume of ammonia (NH3), a second percentage by volume of nitrogen (N2), a third percentage by volume of silane (SiH4) and a fourth percentage by volume of an oxidizer. The fourth percentage by volume of said oxidizer is at least 0.5 percent by volume and less than about (Continued)

8 percent by volume. Then, continuing to flow the reactant gases into the PECVD reactor until the nitride layer is determined to achieve a target thickness over the oxide layer.

16 Claims, 4 Drawing Sheets

(51) Int. Cl.
| | | |
|---|---|---|
| *H01L 21/768* | (2006.01) | |
| *H10B 41/27* | (2023.01) | |
| *H10B 41/35* | (2023.01) | |
| *H10B 43/27* | (2023.01) | |
| *H10B 43/35* | (2023.01) | |

(52) U.S. Cl.
CPC .... *H01L 21/0228* (2013.01); *H01L 21/31116* (2013.01); *H01L 21/76802* (2013.01); *H10B 41/27* (2023.02); *H10B 41/35* (2023.02); *H10B 43/27* (2023.02); *H10B 43/35* (2023.02)

(58) Field of Classification Search
CPC ......... H01L 21/76802; H01L 21/67161; H01L 21/67167; H01L 21/02211; H01L 21/02142; H01L 21/02315; H01L 21/0254; H10B 41/27; H10B 41/35; H10B 43/27; H10B 43/35; H10B 43/50
See application file for complete search history.

(56) References Cited

U.S. PATENT DOCUMENTS

| | | |
|---|---|---|
| 9,196,630 B2 | 11/2015 | Lee et al. |
| 9,312,270 B2 | 12/2016 | Jang et al. |
| 10,134,757 B2 | 11/2018 | Chun et al. |
| 2009/0163041 A1 | 6/2009 | Mungekar et al. |
| 2011/0236594 A1* | 9/2011 | Haverkamp .......... C23C 16/345 |
| | | 118/723 R |
| 2012/0064682 A1 | 3/2012 | Jang et al. |
| 2013/0059422 A1 | 3/2013 | Lee et al. |
| 2015/0060988 A1 | 5/2015 | Lee et al. |
| 2015/0126007 A1 | 7/2015 | Jang et al. |
| 2018/0130701 A1 | 10/2018 | Chun et al. |
| 2019/0035810 A1 | 1/2019 | Chun et al. |
| 2019/0081072 A1 | 3/2019 | Chun et al. |

* cited by examiner

NITRIDE FILMS WITH IMPROVED ETCH SELECTIVITY FOR 3D NAND INTEGRATION

CLAIM OF PRIORITY

This application is a national stage filing of and claims priority, under 35 U.S.C. § 371, to PCT/US2019/055262, filed on Oct. 8, 2019, and entitled "NITRIDE FILMS WITH IMPROVED ETCH SELECTIVITY FOR 3D NAND INTEGRATION", which claims the benefit of U.S. Provisional Application No. 62/757,704, filed on Nov. 8, 2018, and entitled "NITRIDE FILMS WITH IMPROVED ETCH SELECTIVITY FOR 3D NAND INTEGRATION", of which are incorporated by reference herein in their entirety.

FIELD OF THE DISCLOSURE

The present embodiments relate to methods and systems for fabricating semiconductor devices, and in particular, methods for forming films with improved selectivity and performance used in the fabrication of 3D NAND memory structures.

DESCRIPTION OF THE RELATED ART

Over time, the demand for higher performing devices has correspondingly caused a demand for more memory. To meet this demand, semiconductor fabrication technologies have explored ways of increasing the density of memory structures. Traditionally, memory structures were fabricated in two dimensional (2D) memory arrays. These memory structures worked well, but eventually the fabrication limit on the amount of memory devices that can be placed in a specific chip area would be reached. To overcome this limitation, design and fabrication techniques were used to construct three dimensional (3D) memory arrays. Today, these 3D memory arrays are referred to as vertical NAND or 3D-NAND memory structures. A 3D-NAND structure is dependent on depositing alternating layers of oxide/nitride oxide/nitride (ONON) to form a mold stack. In this mold stack, nitride is ultimately stripped and replaced with tungsten to form the wordlines. The nitride films used in a typical replacement gate 3D-NAND mold stack are typically deposited with silane ($SiH_4$), ammonia ($NH_3$) and nitrogen ($N_2$) in a PECVD reactor.

These films tend to have higher amounts of hydrogen (H) and tend to have higher density. This tends to affect dry etch rates of these films and leads to issues such as striations and pillar holes with bowed CD's. The impact of having higher H leads to outgassing of H during subsequent processing steps that also leads to undesirable integration effects Films with higher H also tend to change stress during subsequent anneal due to release of H. In addition, nitride films tend to have high in plane displacement (IPD) that lead to challenges with correction in scanners implemented during lithography steps. It is also understood that the overall IPD of an ONON mold stack is dominated by the nitride film IPD. Any small changes in the unit film IPD can have a big impact on the overall stack IPD film uniformity (NU %) of the nitride layers, and therefore plays a very important role in defining the gate length of a device and affects the threshold voltage (Vt) of the 3D-NAND device.

It is in this context that embodiments of this disclosure arise.

SUMMARY

Embodiments of the disclosure relate to improved techniques for forming material layers that are useful in the formation of an ONON mold stack that is used for fabricating 3D-NAND memory devices. In one embodiment, the embodiments described herein relate to improvements in the formation of the nitride layer of the ONON mold stack. The improvement relates to a way of uniquely tuning the nitride film during the deposition process. Broadly speaking, the turning of the nitride film is accomplished by adding a controlled amount of an oxidizer to the reactants used in forming the nitride layer. As a result of tuning the nitride film, the 3D-NAND mold stack is able to improve dry etch selectivity, improve in plane displacement (IPD), as well as improve non-uniformity while lowering the hydrogen content of the nitride film. In one embodiment, the oxidizer that is added can be provided by any gaseous or liquid material flow that includes oxygen. Example oxidizers may include oxygen ($O_2$), carbon dioxide ($CO_2$), nitrous oxide ($N_2O$), or other O containing supplies. Additionally, the oxidizer used as a tuning knob in the formation of the nitride layer may also be an oxidizer typically used for the deposition of the oxide layers in the ONON (oxide/nitride/oxide/nitride) 3D-NAND stack.

The approach of tuning the formation of the nitride layer of an ONON mold stack with an oxidizer is counterintuitive. That is, oxidizers are typically used to deposit the oxide in the ONON mold stack, and the oxide layer needs to have selectivity to the nitride layer during wet removal of the nitride layer. If this is selectivity balance is altered too much or not enough, the process of nitride removal to form the 3D-NAND stack will be compromised. As such, the embodiments described herein provide for a controlled and tuned manner for applying an oxidizer in the formation of the nitride layer that does not upset the fundamental properties of the nitride layer and thus does not upset or compromise the selectivity to the oxide.

In one embodiment, a method for depositing a nitride layer over an oxide layer to form an oxide-nitride stack is disclosed. The method includes supplying an inert gas to a plasma enhanced chemical vapor deposition (PECVD) reactor that supports a substrate having said oxide layer. Then, providing power to an electrode of the PECVD reactor, where the power is configured to strike a plasma. Then, flowing reactant gases into the PECVD reactor. The reactant gases include a first percentage by volume of ammonia ($NH_3$), a second percentage by volume of nitrogen ($N_2$), a third percentage by volume of silane ($SiH_4$) and a fourth percentage by volume of an oxidizer. The fourth percentage by volume of said oxidizer is at least 0.5 percent by volume and less than about 8 percent by volume. Then, continuing to flow the reactant gases into the PECVD reactor until the nitride layer is determined to achieve a target thickness over the oxide layer.

These and other advantages will be appreciated by those skilled in the art upon reading the entire specification and the claims.

DESCRIPTION

Embodiments of the disclosure provide fabrication methods for enabling tuning of the formation of a nitride layer used in a 3D-NAND mold stack. The tuning is enabled by setting an amount of oxidizer that will be added during the deposition of the nitride layer. The amount of oxidizer is set to achieve improvements in the nitride layer performance. Nitride layer performance has shown improvements in dry etch selectivity, in plane displacement (IPD), reductions of non-uniformity, and lowering of the hydrogen content in the nitride film.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably.

In one embodiment, the nitride film is tuned by adding a small amount of oxidizer in a same plasma enhanced chemical vapor deposition (PECVD) chamber used to deposit the nitride layer. The nitride layer, in one embodiment, is formed by a mixture of silane ($SiH_4$), ammonia ($NH_3$) and nitrogen ($N_2$). For example, the PECVD reactor is run by initially flowing argon (Ar) and nitrogen ($N_2$) and supplying power to strike a plasma. Once the plasma is ignited, a mixture of $SiH_4$, $NH_3$, and $N_2$ are introduced. In one example implementation, the approximate percentages by volume for $NH_3$ is about 50% and $N_2$ is from about 42% to 48%, and the amount of $SiH_4$ ranges from about 2% to about 8%. The combination of $NH_3$, $N_2$ and $SiH_4$ is considered the reactants that form the deposited nitride film of the ONON stack. Now, in addition to these reactants, an embodiment of this disclosure teaches to tune the nitride layer composition by adding an oxidizer. The percentage amount of oxidizer added, in one embodiment, is in the order of the percentage of $SiH_4$ in the reactants. In one example, the amount of $NH_3$ is about 50%, the amount of $N_2$ is about 45%, the amount of $SiH_4$ is about 2%, and the amount of oxidizer, e.g., nitrous oxide ($N_2O$) is about 3%. It should be understood that the 50% by volume of $NH_3$ may also vary by 10 percent up or down, and so can the 45% by volume of $N_2$.

As mentioned earlier, the oxidizer may be any gas or liquid that can introduce oxygen. The example oxidizers should therefore include $O_2$, $CO_2$, $N_2O$, and any other oxygen containing gas or liquid or those used in the formation of the oxygen layer of the ONON mold stack.

Thus, by way of example, by volume, the amount of oxidizer is approximately the same as that of silane $SiH_4$, or slightly more, in relation to the overall volume of reactants supplied for deposition of each of the nitride layers of the ONON mold stack. In one embodiment, the percentage by volume of oxidizer added, is less than about 8% of the volume of added reactant for depositing a nitride layer. In another example, the percentage by volume of oxidizer added, is less than about 5% of the volume of added reactant for depositing a nitride layer. It should be understood that adding the oxidizer to the reactant used for depositing the nitride layer should be enough to influence the noted benefits, including the reduction of hydrogen from the composition of the nitride layer. The tuning of the added oxidizer, therefore, contemplates adding at least about 0.5% by volume of oxidizer in the overall reactant, and in another embodiment, at least about 1% by volume of oxidizer in the overall reactant, but less than about 8% by volume of the overall reactant. For purposes of clarity, the overall reactant means the gases needed to form a nitride layer in the ONON mold stack, when processed in a plasma reactor.

In accordance with one embodiment, the process of adding an oxidizer to the nitrides layer deposition process reduces the density of the film moving it towards an oxide, and in doing so reduces the overall hydrogen in the nitride film. The reduction in hydrogen in the nitride film is confirmed during an inspection of the resulting nitride layer, which shows a reduction of stress shift in the film after anneal.

Furthermore, in testing of a resulting nitride layer that is tuned, in accordance with one embodiment, it can be confirmed that the hydrogen content is reduced in tuned nitride layers. By way of example, the refractive index of a nitride layer that has not been tuned with an oxidizer additive is about 1.9. The refractive index of an oxide layer, e.g., that is used in an ONON mold stack, is about 1.5. The oxide layer is believed to have little to no hydrogen component, while the un-tuned nitride layer does contain hydrogen. In the testing of nitride layers that have been formed with the tuning additive of an oxide, it was observed that the refractive index dropped to between 1.84-1.88. As a result, this will improve the dry etch rate control when forming the 3D-NAND structure. Furthermore, in anneal steps, hydrogen is released, which changes the stress of the nitride film making it more tensile. Consequently, the reduction of hydrogen density in the tuned nitride layer will reduce the changes in stress.

Further, a nitride film without tuning is more tensile in nature than an oxide film. As such, an oxide film is more compressive than is a nitride film that has not been tuned with an oxidizer as disclosed herein. Thus, based on empirical testing of a tuned nitride layer that has been formed with an amount of oxidizer, it was discovered that the resulting nitride layer was more compressive. However, for an ONON mold stack used for making 3D-NAND, it is more optimal for the nitride layer to remain more tensile, instead of compressive as is the oxide layer. Accordingly, in one embodiment, when the nitride layer is deposited using the oxidizer, an adjustment in power supplied during the deposition is made. This adjustment in power, in one embodiment, includes reducing the power level by about 10-20%. In some embodiments, the power level for the PECVD reactor is reduced at least 5% lower than if the power were supplied to the PECVD reactor when depositing a nitride layer that has not received the oxidizer. For instance, the reducing in power may be in the order of 1000 watts, for a system that typically supplies 4500 watts, e.g., supplying only 3500 watts. This reduction in power during the deposition of the nitride layer that is tuned with an amount of oxidizer assists in making the resulting nitride layer more tensile, which counteracts the tendency of the nitride layer turning more compressive (e.g., by adding the oxidizer and not adjusting the power downward).

In one embodiment, by turning the nitride layer with the oxidizer and the reduced power, it was seen from testing that the nitride layer growth rate increases, at least 2-10% more. This is seen as beneficial for increasing throughput in processing associated with making 3D-NAND memory structures.

A further advantage of the tuned nitride layer, is that reduced density will improve the dry etch rates of the films which reduces striations/bending in pillar profiles. As mentioned, the IPD for the tuned nitride film also significantly improves with addition of a small amount of oxidizer dopant, e.g., less than about 8% by volume of reactant. As a result, this improves the IPD of the overall mold stack and will improve the overlay margin of a nitride layer deposition process. As also mentioned, the addition of the oxidizer also improves the overall film non-uniformity (NU %), which will enable tighter gate length control and eventually lead to improved threshold voltage control.

Some further example advantages of tuning the nitride layer deposition with the addition of an oxidizer during deposition include: (a) oxygen doping of nitride layer reactants modulate the refractive index and reduce film density of the nitride layer; (b) enables a lower IPD for the resulting nitride layer; (c) reduces the non-uniformity overall nitride layer; (d) induces a low hydrogen content, which improves thermal stability; and (e) increases film deposition rates compared to non-oxide doped nitride layers. These are only some of the advantages of doping the reactants with an oxidizer dose when forming a nitride layer used forming ONON mold structures of 3D-NAND devices. As such, the above list is not exhaustive of other benefits that may be seen by practicing the process of producing a nitride layer with a reactant that is doped with a small amount of oxidizer.

Table A below provides a comparison of an un-tuned nitride layer versus a tuned nitride layer. As described herein, the tuned nitride layer is one that has been formed by adding a small amount of oxidizer to the reactants supplied to a PECVD reactor for the deposition nitride. As used herein, a small amount of oxidizer is considered to be between about 0.5% by volume to about 8% by volume of the overall reactant used to deposit the nitride layer. In another embodiment, the small amount of oxidizer is considered to be between about 1% by volume to about 5% by volume of the overall reactant used to deposit the nitride layer. In yet another embodiment, the small amount of oxidizer is about the same or slightly more than the amount of silane NH4 by volume in the reactant used to deposit the nitride layer. By way of example, the silane by volume may be about 4% by volume and the oxidizer may be about 4% by volume. In a second embodiment, the silane by volume may be about 2% by volume and the oxidizer may be about 3% by volume. In this second embodiment, 3% is one third greater than 2%, yet both 3% and 2% by volume is relatively small as compared to the total volume of the reactants used for depositing the tuned nitride layer. In one embodiment, the slightly lower amount of silane to oxidizer may vary, depending on the application.

The values shown here are only for comparison, as measured from tested nitride layers that were deposited on semiconductor wafers. The results may also vary depending on other controllable parameters, e.g., temperature, pressure, power, timing, flow rates, and/or other recipe conditions. Nevertheless, for the conducted tests, the example benefits clearly show many improvements over un-tuned or traditional nitride layers used in ONON mold stacks.

TABLE A

| Example Properties | Un-Tuned Nitride Layer | Tuned Nitride Layer | Example Benefits |
| --- | --- | --- | --- |
| Deposition Rate (Å/min) | 1950 | ~2200 | Higher Throughput |
| Non-uniformity % | 1.51 | ~1.03 | Better film uniformity |
| Refractive index | 1.918 | Tunable (1.84-1.88) | Dry etch rate control |
| Stress (MPa) | 254 | ~237 (tunable) | Matched |
| Anneal delta stress (Mpa) | 190 | ~150 | Better film stability, lower hydrogen |
| IPD (nm) | 2.9 | ~2.0 | Better overlay control |
| Stack IPD (nm) | 5.8 | ~3.0 | Better overlay control |

The following description provides additional information regarding the fabrication of memory devices, where the nitride layer is tuned as described above. Thus, to provide more context to the fabrication process of making 3D-NAND structures, reference will be made to FIG. 1-FIG. 7. It should be understood that in making the nitride films 102, the embodiments include tuning the deposition process of the nitride layer by including the small amounts of oxidizer.

Figure 1:
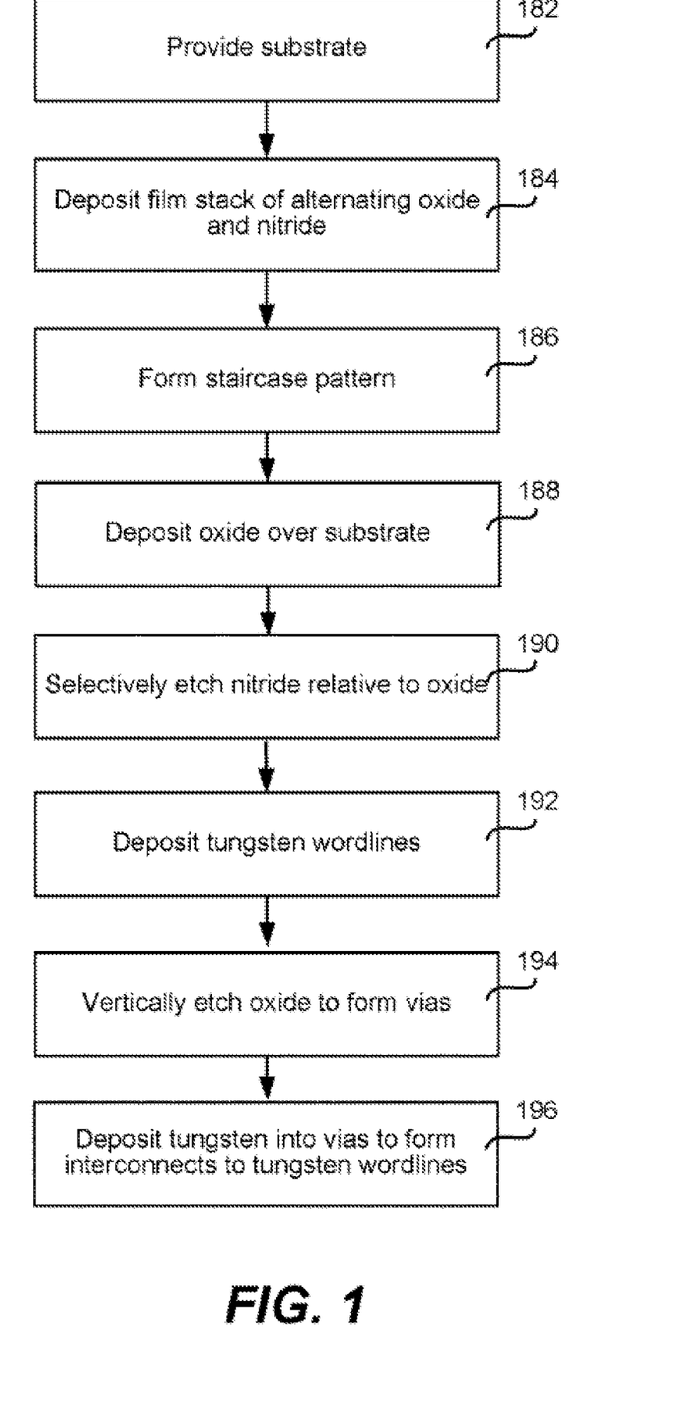
FIG. 1 is a process flow diagram depicting operations for a method for forming at least part of a 3D-NAND and corresponding ONON mold stack.
Figure 2:
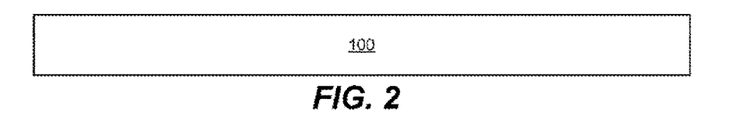
FIGS. 2, 3, 4A and 4B are schematic illustrations of a substrate in a patterning method, which use a tuned nitride layer in the ONON mold stack.

FIG. 1 shows a process flow diagram of operations performed in accordance with a method for forming a 3D-NAND structure. In operation 182, a substrate is provided. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. An example substrate 100 is provided as a schematic illustration in FIG. 2.

Returning to FIG. 1, in operation 184, a film stack of alternating oxide and nitride films is deposited on the substrate. In various embodiments, the oxide layer deposited is a silicon oxide layer. In various embodiments, the nitride layer deposited is a silicon nitride layer that has been tuned by the inclusion of an oxidizer in the reactants used to deposit the nitride. As mentioned above, in addition to adding a small amount of oxidizer to the nitride forming reactants, the power may be lowered in order to make the nitride layer more tensile. That is, since the oxidizer is believed to make the tuned nitride layer more compressive, lowering the power supplied to the reactor will assist in shifting the nitride layer to be more tensile, or at least as tensile as a nitride material that has not been doped with the oxidizer.

Each oxide and nitride layer is deposited to about the same thickness, such as between about 10 nm and about 100 nm, or about 350 Å in some embodiments. The oxide layers may be deposited at a deposition temperature of between about room temperature and about 600° C. It will be understood that "deposition temperature" (or "substrate temperature") as used herein refers to the temperature that the pedestal holding the substrate is set to during deposition.

Oxide and nitride layers for forming the alternating oxide and nitride film stack may be deposited using any suitable technique, such as atomic layer deposition (ALD), plasma enhanced atomic layer deposition (PEALD), chemical vapor deposition (CVD), plasma enhanced chemical vapor deposition (PECVD), or sputtering. In various embodiments, the oxide and nitride layers are deposited by PECVD.

The film stack may include between 48 and 512 layers of alternating oxide and nitride layers, whereby each oxide or nitride layer constitutes one layer. The film stack including the alternating oxide and nitride layers may be referred to as an ONON stack.

Figure 3:
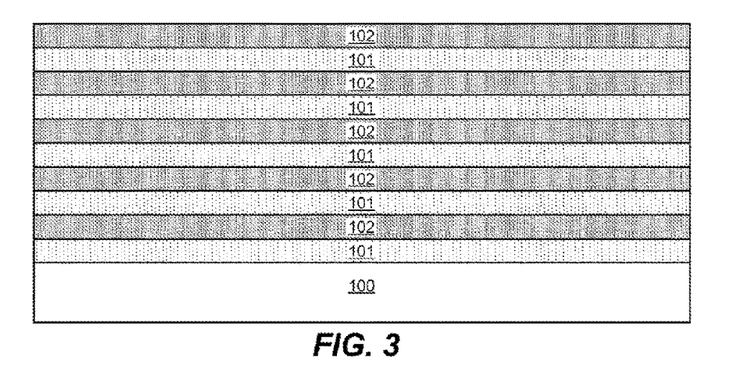

FIG. 3 shows an example schematic illustration of a substrate 100 with alternating oxide (101) and nitride (102) films deposited on the substrate 100. Note that while the structure shown in FIG. 3 shows an oxide deposited first, followed by nitride, oxide, nitride, etc., nitride may be deposited first, followed by oxide, nitride, oxide, etc.

Following deposition of the ONON stack, channels (not shown in FIG. 3) may be etched in the substrate. Subsequently, referring to FIG. 1, in operation 186, a staircase pattern is formed on the substrate. A "staircase pattern" as referred to herein includes two or more steps, each step including an oxide and a nitride layer. It will be understood that the top layer of each set of oxide and nitride layers may be either an oxide or a nitride for formation of steps in a staircase. In various embodiments, the staircase pattern includes between 24 and 256 steps. The staircase pattern may be formed using a variety of patterning techniques. For example, one technique may include depositing a sacrificial layer over the substrate and masking regions of the substrate to etch each set of oxide and nitride layers to form the staircase.

Figure 4A:
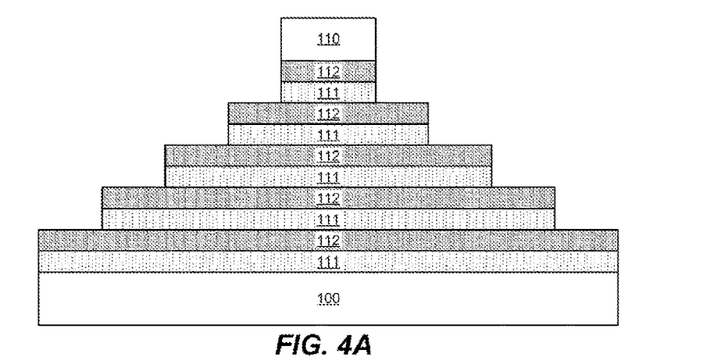

FIG. 4A provides an example of a substrate 100 including a staircase pattern of oxide (111) and nitride (112) layers with a hardmask 110 over the topmost nitride layer. Although FIG. 4A shows four steps of a staircase pattern, it will be understood that a staircase pattern may have between 24 and 256 steps. Each step includes a nitride and oxide layer, and distance d as shown in FIG. 4A may be between about 150 nm and about 1000 nm, such as about 500 nm. This region of each step extending out from the edge of the step above it may be referred to as a "pad."

Figure 4B:
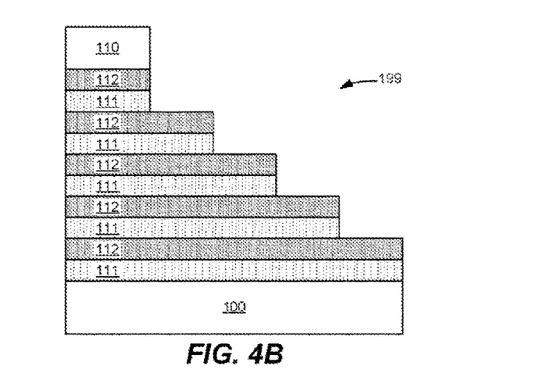

For purposes of discussion, the following discussion and subsequent schematic illustrations of the substrate will include a half view 199 as shown in FIG. 4B.

In operation 188 of FIG. 1, oxide is deposited over the substrate. In various embodiments, the oxide may be the same composition as the oxide deposited in layers of the ONON stack. In various embodiments, the oxide deposited over the substrate is deposited at a different deposition temperature than the deposition temperature used for depositing the oxide layers in the ONON stack. The deposition temperature may be between room temperature and about 600° C. Vertical slits may be subsequently etched into the substrate after depositing oxide.

Figure 5A:
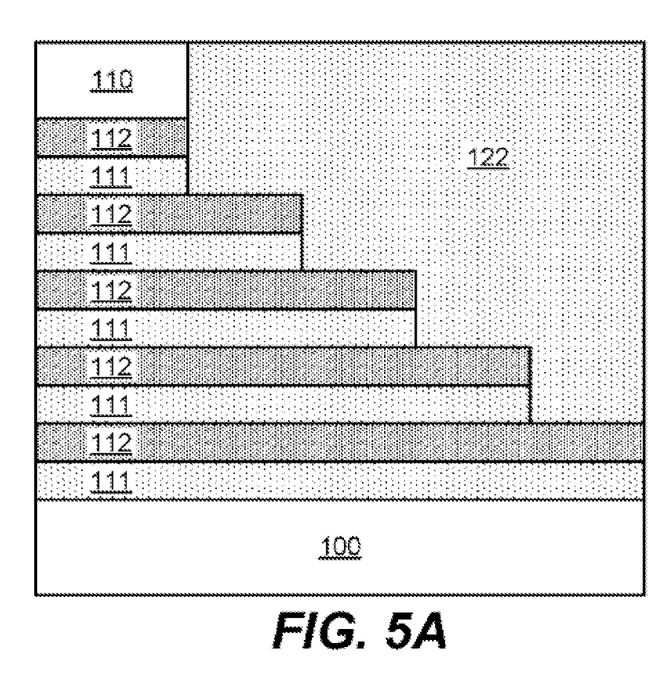
FIGS. 5A and 5B illustrate patterning utilized in forming the 3D-NAND.
Figure 5B:
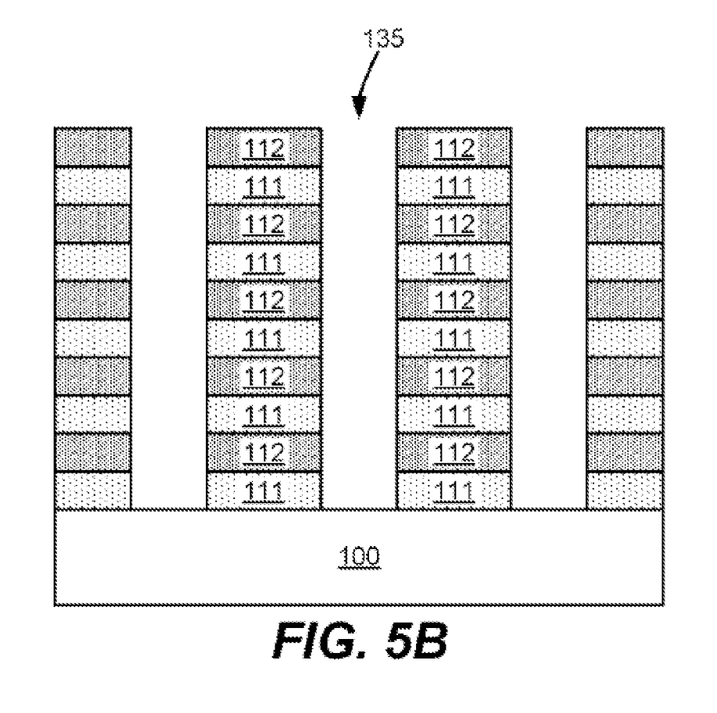

FIG. 5A shows an example substrate 100 including the ONON staircase, hardmask 110, and oxide 122 deposited over the substrate. FIG. 5B shows a side view of the substrate 100 after vertical slits 130 are etched.

In operation 190, nitride is selectively etched relative to oxide on the substrate. Etching may be performed using a selective dry etch process, such as by exposing the substrate to any one or more of the following gases: chlorine ($Cl_2$), oxygen ($O_2$), nitrous oxide ($N_2O$), tetrafluoromethane ($CF_4$), sulfur tetrafluoride ($SF_4$), carbon dioxide ($CO_2$), fluoromethane ($CH_3F$), nitrogen trifluoride ($NF_3$), nitrogen ($N_2$), hydrogen ($H_2$), ammonia ($NH_3$), methane ($CH_4$), sulfur hexafluoride ($SF_6$), argon (Ar), carbonyl sulfide (COS), carbon disulfide ($CS_2$), hydrogen sulfide ($H_2S$), and nitric oxide (NO). This operation removes the nitride layers from the ONON stack such that etch species flow into the vertical slit and selectively etches nitride. It will be understood that the selective etching involves etching a first material at a rate faster than etching a second material. For example, selectively etching nitride relative to oxide means nitride is etched at a faster rate than etching of oxide. Nitride is selectively etched using a wet etch process, such as by exposing the substrate to phosphoric acid ($H_3PO_4$) and/or diluted hydrofluoric acid ("DHF") or a mixture of these solutions.

In operation 192, tungsten is deposited into the gaps of the substrate to form tungsten wordlines. Tungsten may be deposited by any suitable technique, such as ALD, CVD, PEALD, and/or PECVD. In some embodiments, a barrier layer and/or a tungsten nucleation layer is deposited prior to depositing bulk tungsten. In operation 194, the oxide is vertically etched to form vias. The oxide may be etched by dry etching using exposure to one or more of the following gases: $O_2$, Ar, $C_4F_6$, $C_4F_8$, $SF_6$, $CHF_3$, and $CF_4$. In operation 196, tungsten is deposited in the vias to form interconnects to the tungsten wordlines.

The innovation to tune the nitride layer by use of oxidizers would have typically been used only for the oxide layers and not in the nitride layers. For instance, use of oxidizers during nitride deposition would be considered risky as this would drop the selectivity between oxide and nitride during the nitride removal. However, by using the small amounts of oxidizers as mentioned above, a balance is established such that the resulting nitride layers can yield many beneficial results. As noted above, some of these benefits are improvements on IPD, lower hydrogen content, and improvement by reducing NU %. Further, the cost and reliability of a device will be improved while offering a film that will etch easily with lower striations and will have a controlled etch profile through the stack.

Figure 6:
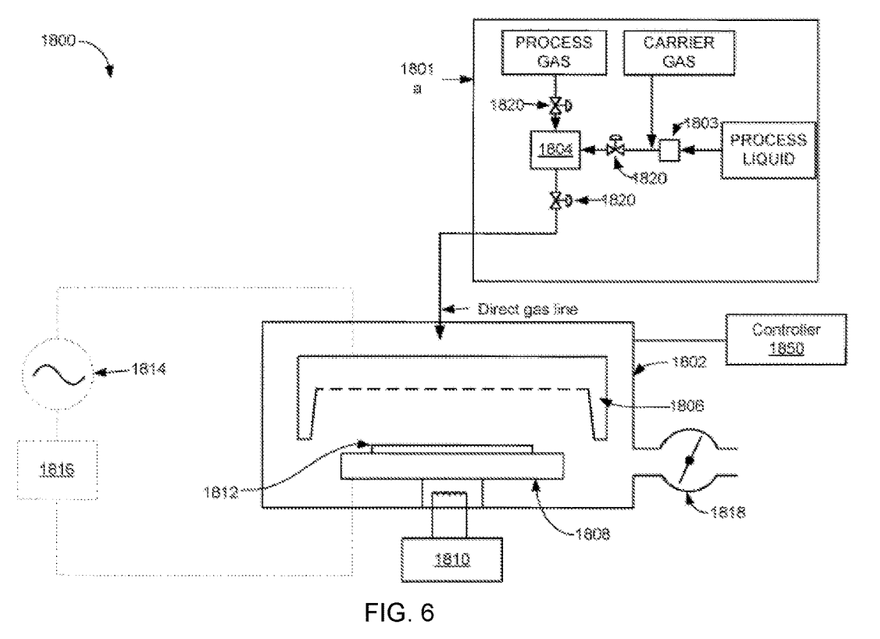
FIGS. 6 and 7 illustrate example tool configurations that may be used to fabricate a semiconductor substrate, and in one embodiment, deposit a nitride layer that has been tuned in accordance with one embodiment.
Figure 7:
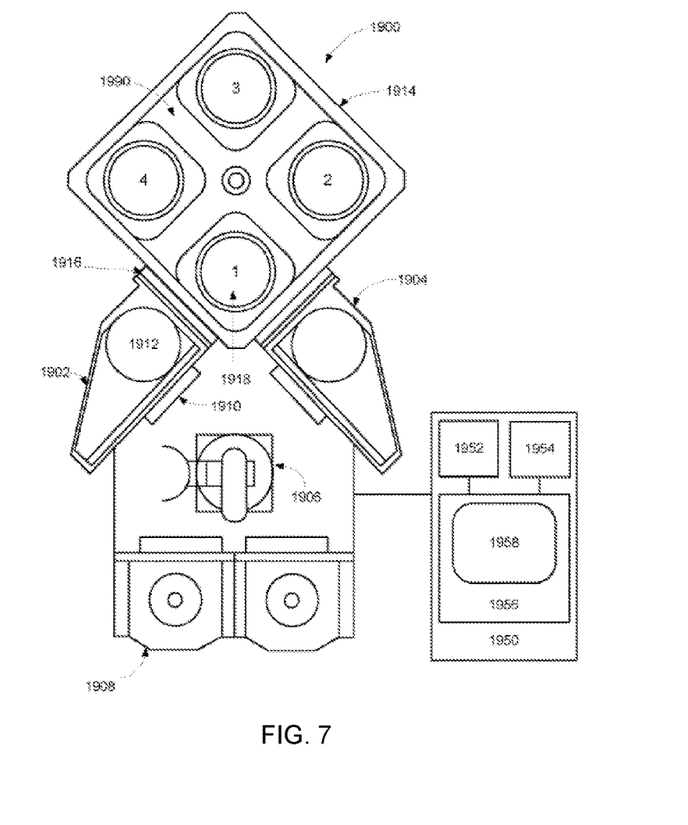

FIG. 6 and FIG. 7 show example apparatus structures that may be used for the processing and deposition of the tuned nitride layer. FIC. 6 depicts a schematic illustration of an embodiment of an atomic layer deposition (ALD) and/or chemical vapor deposition (CVD) process station 1800 having a process chamber body 1802 for maintaining a low-pressure environment. A plurality of process stations 1800 may be included in a common low pressure process tool environment. For example, FIC. 7 depicts an embodiment of a multi-station processing tool 1900. In some embodiments, one or more hardware parameters of ALD process station 1800 including those discussed in detail below may be adjusted programmatically by one or more computer controllers 1850.

Process station 1800 fluidly communicates with reactant delivery system 1801a for delivering process gases to a distribution showerhead 1806. Reactant delivery system 1801a includes a mixing vessel 1804 for blending and/or conditioning process gases, such as a silicon precursor gas, or second reactant gas (e.g., a carbon-containing reactant), for delivery to showerhead 1806. One or more mixing vessel inlet valves 1820 may control introduction of process gases to mixing vessel 1804. Plasma may also be delivered to the showerhead 1806 or may be generated in the process station 1800. Reactant delivery system 1801a may be configured to deliver process gases for depositing a carbon-containing encapsulation over a substrate provided in the process station 1800.

As an example, the embodiment of FIG. 6 includes a vaporization point 1803 for vaporizing liquid reactant to be supplied to the mixing vessel 1804. In some embodiments, vaporization point 1803 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 1803 may be heat traced. In some examples, mixing vessel 1804 may also be heat traced. In one non-limiting example, piping downstream of vaporization point 1803 has an increasing temperature profile extending from approximately 100° C. to approximately 150° C. at mixing vessel 1804.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 1803. In one scenario, a liquid injector may be mounted directly to mixing vessel 1804. In another scenario, a liquid injector may be mounted directly to showerhead 1806.

In some embodiments, a liquid flow controller (LFC) upstream of vaporization point 1803 may be provided for controlling a mass flow of liquid for vaporization and delivery to process station 1800. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 1806 distributes process gases toward substrate 1812. In the embodiment shown in FIC. 6, the substrate 1812 is located beneath showerhead 1806 and is shown resting on a pedestal 1808. Showerhead 1806 may have any suitable shape, and may have any suitable number and arrangement of ports for distributing process gases to substrate 1812.

In some embodiments, pedestal 1808 may be raised or lowered to expose substrate 1812 to a volume between the substrate 1812 and the showerhead 1806. It will be appreciated that, in some embodiments, pedestal height may be adjusted programmatically by a suitable computer controller 1850.

In another scenario, adjusting a height of pedestal 1808 may allow a plasma density to be varied during plasma activation cycles in the process in embodiments where a plasma is ignited. At the conclusion of the process phase, pedestal 1808 may be lowered during another substrate transfer phase to allow removal of substrate 1812 from pedestal 1808.

In some embodiments, pedestal 1808 may be temperature controlled via heater 1810. In some embodiments, the pedestal 1808 may be heated to a temperature of at least about 250° C., or in some embodiments, less than about 300° C., such as about 250° C., during deposition of silicon nitride films as described in disclosed embodiments. In some embodiments, the pedestal is set at a temperature between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 1800 may be provided by butterfly valve 1818. As shown in the embodiment of FIC. 6, butterfly valve 1818 throttles a vacuum provided by a downstream vacuum pump (not shown). However, in some embodiments, pressure control of process station 1800 may also be adjusted by varying a flow rate of one or more gases introduced to the process station 1800.

In some embodiments, a position of showerhead 1806 may be adjusted relative to pedestal 1808 to vary a volume between the substrate 1812 and the showerhead 1806. Further, it will be appreciated that a vertical position of pedestal 1808 and/or showerhead 1806 may be varied by any suitable mechanism within the scope of the present disclosure. In some embodiments, pedestal 1808 may include a rotational axis for rotating an orientation of substrate 1812. It will be appreciated that, in some embodiments, one or more of these example adjustments may be performed programmatically by one or more suitable computer controllers 1850.

In some embodiments where plasma may be used as discussed above, showerhead 1806 and pedestal 1808 electrically communicate with a radio frequency (RF) power supply 1814 and matching network 1816 for powering a plasma. In some embodiments, the plasma energy may be controlled by controlling one or more of a process station pressure, a gas concentration, an RF source power, an RF source frequency, and a plasma power pulse timing. For example, RF power supply 1814 and matching network 1816 may be operated at any suitable power to form a plasma having a desired composition of radical species. Examples of suitable powers are included above. Likewise, RF power supply 1814 may provide RF power of any suitable frequency. In some embodiments, RF power supply 1814 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 180 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1850 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as a carbon-containing reactant, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the disclosed embodiments.

As described above, one or more process stations may be included in a multi-station processing tool. FIG. 7 shows a schematic view of an embodiment of a multi-station processing tool 1900 with an inbound load lock 1902 and an outbound load lock 1904, either or both of which may include a remote plasma source. A robot 1906 at atmospheric pressure is configured to move wafers from a cassette loaded through a pod 1908 into inbound load lock 1902 via an atmospheric port 1910. A wafer is placed by the robot 1906 on a pedestal 1912 in the inbound load lock 1902, the atmospheric port 1910 is closed, and the load lock is pumped down. Where the inbound load lock 1902 includes a remote plasma source, the wafer may be exposed to a remote plasma treatment in the load lock prior to being introduced into a processing chamber 1914. Further, the wafer also may be heated in the inbound load lock 1902 as well, for example, to remove moisture and adsorbed gases. Next, a chamber transport port 1916 to processing chamber 1914 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 1914 includes four process stations, numbered from 1 to 4 in the embodiment shown in FIG. 7. Each station has a heated pedestal (shown at 1918 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 1914 may include one or more matched pairs of ALD and plasma-enhanced ALD process stations. While the depicted processing chamber 1914 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 depicts an embodiment of a wafer handling system 1990 for transferring wafers within processing chamber 1914. In some embodiments, wafer handling system 1990 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 1950 employed to control process conditions and hardware states of process tool 1900. System controller 1950 may include one or more memory devices 1956, one or more mass storage devices 1954, and one or more processors 1952. Processor 1952 may include a CPU or computer, analog, and/or digital input/output connections, stepper motor controller boards, etc.

In some embodiments, system controller 1950 controls all of the activities of process tool 1900. System controller 1950 executes system control software 1958 stored in mass storage device 1954, loaded into memory device 1956, and executed on processor 1952. Alternatively, the control logic may be hard coded in the controller 1950. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1958 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 1900. System control software 1958 may be configured in any suitable way. For example, various process tool component subroutines or control objects may be written to control operation of the process tool components used to carry out various process tool processes. System control software 1958 may be coded in any suitable computer readable programming language.

In some embodiments, system control software 1958 may include input/output control (IOC) sequencing instructions for controlling the various parameters described above. Other computer software and/or programs stored on mass storage device 1954 and/or memory device 1956 associated with system controller 1950 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1918 and to control the spacing between the substrate and other parts of process tool 1900.

A process gas control program may include code for controlling gas composition (e.g., silicon precursor gases, and carbon-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate. A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1950. The user interface may include a display screen, graphical software displays of the apparatus and/or process conditions, and user input devices such as pointing devices, keyboards, touch screens, microphones, etc.

In some embodiments, parameters adjusted by system controller 1950 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1950 from various process tool sensors. The signals for controlling the process may be output on the analog and digital output connections of process tool 1900. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1950 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 1950 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 1950.

In some implementations, the system controller 1950 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1950, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1950 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1950 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1950, in some implementations, may be a part of or coupled to a computer that is integrated with, coupled to the system, otherwise networked to the system, or a combination thereof. For example, the system controller 1950 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1950 receives instructions in the form of data, which specify parameters for each of the processing steps to be performed during one or more operations. It should be understood that the parameters may be specific to the type of process to be performed and the type of tool that the system controller 1950 is configured to interface with or control. Thus as described above, the system controller 1950 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 1950 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Etching operations described herein, such as for etching nitride or oxide, may be performed in any suitable process chamber. In some embodiments, substrates may be etched in an inductively coupled plasma (ICP) reactor.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for depositing a nitride layer over an oxide layer to form an oxide-nitride stack, comprising:
    supplying an inert gas to a plasma enhanced chemical vapor deposition (PECVD) reactor that supports a substrate having said oxide layer;
    providing power to an electrode of the PECVD reactor, the power is configured to strike a plasma;
    flowing reactant gases into the PECVD reactor, the reactant gases include a first percentage by volume of ammonia (NH3), a second percentage by volume of nitrogen (N2), a third percentage by volume of silane (SiH4) and a fourth percentage by volume of an oxidizer, wherein the fourth percentage by volume of said oxidizer is at least 0.5 percent by volume and less than about 8 percent by volume;
    continuing to flow the reactant gases into the PECVD reactor until the nitride layer is determined to achieve a target thickness over the oxide layer.

2. The method of claim 1, wherein the third percentage by volume of said silane (SiH4) is about the same as the fourth percentage by volume of said oxidizer or slightly lower.

3. The method of claim 2, wherein the first percentage by volume of ammonia (NH3) is about 50%, the second percentage by volume of the nitrogen (N2) is about 45%, the third percentage by volume of the silane (SiH4) is about 2% and the fourth percentage by volume of the oxidizer is about 3%.

4. The method of claim 1, further comprising,
    reducing a power level of the power supplied to the PECVD reactor for when the oxidizer is included as the fourth percentage by volume of the reactant gases used for depositing the nitride layer.

5. The method of claim 1, wherein including the fourth percentage by volume of said oxidizer assists in reducing hydrogen content in the nitride layer.

6. The method of claim 1, wherein including the fourth percentage by volume of said oxidizer increases a dry etch rate of said nitride layer.

7. The method of claim 1, wherein including the fourth percentage by volume of said oxidizer increases a deposition rate of said nitride layer.

8. The method of claim 1, wherein including the fourth percentage by volume of said oxidizer reduces a refractive index of said nitride layer.

9. The method of claim 1, wherein including the fourth percentage by volume of said oxidizer reduces a stress MPa of the nitride layer.

10. The method of claim 1, wherein including the fourth percentage by volume of said oxidizer reduces in plane displacement (IPD) of the nitride layer.

11. The method of claim 1, wherein including the fourth percentage by volume of said oxidizer improves overlay control of the oxide-nitride stack.

12. The method of claim 1, wherein including the fourth percentage by volume of said oxidizer reduces non-uniformity of said nitride layer.

13. The method of claim 1, wherein the fourth percentage by volume of said oxidizer is tunable to be between about 0.5 percent by volume and less than about 8 percent by volume.

14. The method of claim 1, wherein the oxidizer is one of oxygen (O2), carbon dioxide (CO2), or nitrous oxide (N2O).

15. The method of claim 1, wherein the oxide-nitride stack includes multiple stacks of said oxide layer and said nitride layer, wherein each said nitride layer is formed using said oxidizer.

16. The method of claim 15, wherein the multiple stacks of said oxide layer and said nitride layer are used in fabricating a 3D-NAND memory device.

* * * * *